(12) United States Patent
Scharner et al.

(10) Patent No.: US 9,887,379 B2
(45) Date of Patent: Feb. 6, 2018

(54) ELECTRODE AND OPTOELECTRONIC COMPONENT AND METHOD FOR PRODUCING AN OPTOELECTRONIC COMPONENT

(71) Applicant: OSRAM OLED GmbH, Regensburg (DE)

(72) Inventors: Silke Scharner, Regensburg (DE); Thomas Wehlus, Lappersdorf (DE)

(73) Assignee: OSRAM OLED GmbH, Regensburg (DE)

( * ) Notice: Subject to any disclaimer, the term of this patent is extended or adjusted under 35 U.S.C. 154(b) by 107 days.

(21) Appl. No.: 14/899,582

(22) PCT Filed: Jun. 12, 2014

(86) PCT No.: PCT/EP2014/062261
§ 371 (c)(1),
(2) Date: Dec. 18, 2015

(87) PCT Pub. No.: WO2014/202462
PCT Pub. Date: Dec. 24, 2014

(65) Prior Publication Data
US 2016/0149153 A1    May 26, 2016

(30) Foreign Application Priority Data

Jun. 21, 2013 (DE) .................. 10 2013 106 508

(51) Int. Cl.
*H01L 29/08* (2006.01)
*H01L 51/52* (2006.01)
*H01L 51/56* (2006.01)

(52) U.S. Cl.
CPC ...... *H01L 51/5203* (2013.01); *H01L 51/5206* (2013.01); *H01L 51/5221* (2013.01);
(Continued)

(58) Field of Classification Search
CPC ............ H01L 51/5203; H01L 51/5206; H01L 51/5268; H01L 51/5275; H01L 51/56; H01L 51/5221
(Continued)

(56) References Cited

U.S. PATENT DOCUMENTS

2011/0309347 A1   12/2011  Okada et al.
2014/0008620 A1*  1/2014   Morohashi .......... H01L 51/5203
                                                            257/40

FOREIGN PATENT DOCUMENTS

CN          1695257 A      11/2005
CN        100463578 C       2/2009
(Continued)

OTHER PUBLICATIONS

International Search Report based on application No. PCT/EP2014/062261 (4 pages and 3 Pages of English translation) dated Dec. 15, 2014 (for reference purpose only).
(Continued)

*Primary Examiner* — Hung Vu
(74) *Attorney, Agent, or Firm* — Viering, Jentschura & Partner mbB

(57) ABSTRACT

Various embodiments may relate to an optoelectronic component, including an organic functional layer structure, and an electrode on or above the organic functional layer structure. The electrode is electrically conductively coupled to the organic functional layer structure. The electrode includes an optically transparent or translucent matrix including at least one matrix material, and particles embedded into the matrix. The particles have a refractive index that is greater than the refractive index of the at least one matrix material. A difference in refractive index between the at least one matrix material and the particles embedded into the matrix is at least 0.05.

15 Claims, 2 Drawing Sheets

(52) U.S. Cl.
CPC ...... *H01L 51/5268* (2013.01); *H01L 51/5275* (2013.01); *H01L 51/56* (2013.01); *H01L 2251/301* (2013.01); *H01L 2251/303* (2013.01); *H01L 2251/5369* (2013.01); *H01L 2251/558* (2013.01)

(58) Field of Classification Search
USPC .............................................. 257/40, 59, 72
See application file for complete search history.

(56) References Cited

FOREIGN PATENT DOCUMENTS

| | | | |
|---|---|---|---|
| CN | 102364716 | A | 2/2012 |
| EP | 2398087 | A1 | 12/2011 |
| JP | 2004303724 | A | 10/2004 |
| JP | 2012009225 | A | 1/2012 |
| WO | 2004025749 | A2 | 3/2004 |
| WO | 2011111670 | A1 | 9/2011 |
| WO | 2013080799 | A1 | 6/2013 |

OTHER PUBLICATIONS

Chinese Office Action based on application No. 201480035373.0 (8 pages and 8 pages of English translation) dated Aug. 11, 2016 (Reference Purpose Only).

* cited by examiner

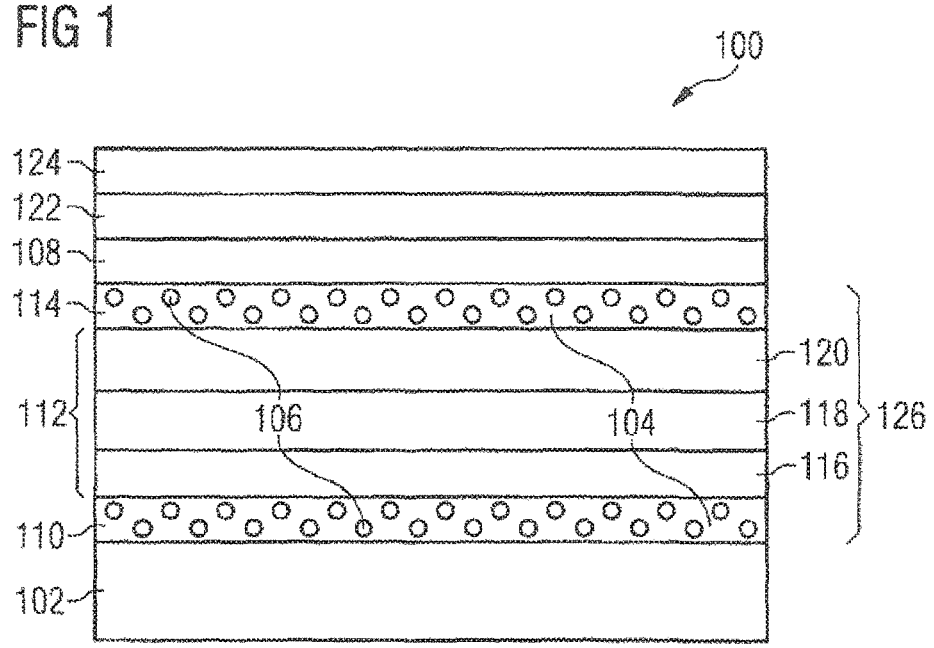

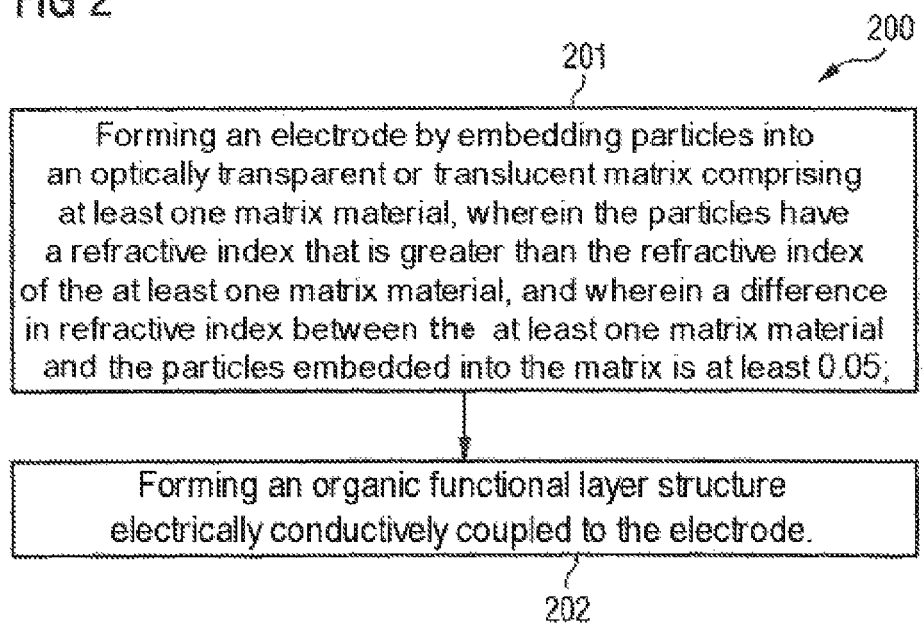

ELECTRODE AND OPTOELECTRONIC COMPONENT AND METHOD FOR PRODUCING AN OPTOELECTRONIC COMPONENT

RELATED APPLICATIONS

The present application is a national stage entry according to 35 U.S.C. § 371 of PCT application No.: PCT/EP2014/062261 filed on Jun. 12, 2014 which claims priority from German application No.: 10 2013 106 508.2 filed on Jun. 21, 2013, and is incorporated herein by reference in its entirety.

TECHNICAL FIELD

In various embodiments, an electrode, an optoelectronic component, and a method for producing an optoelectronic component are provided.

BACKGROUND

Optoelectronic components on an organic basis, for example organic light emitting diodes (OLED), are being increasingly widely used in general lighting, for example as a surface light source. An organic optoelectronic component, for example an OLED, may include an anode and a cathode with an organic functional layer system therebetween. The organic functional layer system may include one or a plurality of emitter layer(s) in which electromagnetic radiation is generated, one or a plurality of charge generating layer structure(s) each composed of two or more charge generating layers (CGL) for charge generation, and one or a plurality of electron blocking layer(s), also designated as hole transport layer(s) (HTL), and one or a plurality of hole blocking layer(s), also designated as electron transport layer(s) (ETL), in order to direct the current flow. The luminance of an OLED is limited, inter alia, by the maximum current density that can flow through the diode. In order to increase the luminance of an OLED it is known to combine one or a plurality of OLEDs one on top of another in series—so-called stacked OLED or tandem OLED.

In one conventional organic light emitting diode, the current distribution and the internal coupling-out are realized in different layers. Typically, a first layer including e.g. indium tin oxide (ITO) or silver (Ag) nanowire percolation anodes has been used hitherto for the current distribution. For the internal coupling-out of the emitted light in a wavelength range of visible light (for example at least in a partial range of the wavelength range of from approximately 380 nm to approximately 780 nm), a second layer has been formed hitherto, said second layer including for example high refractive index particles such as titanium oxide ($TiO_2$) in a low refractive index matrix.

SUMMARY

In various embodiments, an electrode, an optoelectronic component and a method for producing an optoelectronic component are provided which make it possible to simplify the production process. Furthermore, this simplified production process makes it possible to reduce the production costs.

In various embodiments, an electrode is provided, wherein the electrode includes an optically transparent or translucent matrix including at least one matrix material. Particles are embedded in the matrix, said particles having a refractive index that is greater than the refractive index of the at least one matrix material. A difference in refractive index between the at least one matrix material and the particles embedded into the matrix is at least 0.05.

The electrode including matrix and embedded particles is also referred to as a light scattering electrode. The optoelectronic component includes a first electrode on or above a substrate, said first electrode also being referred to as a bottom electrode. An organic functional layer structure is formed on the first electrode. The organic functional layer structure includes an electroluminescent material for emitting electromagnetic radiation. A second electrode is formed on the organic functional layer structure, said second electrode also being referred to as a top electrode. At least the top electrode is formed as a light scattering electrode.

One advantage of an electrode formed in this way resides in the combination of at least two properties, wherein the at least two properties include an optical aspect and an aspect regarding the electrical conductivity. The electrically conductive layer composed of matrix and embedded particles that is formed in the manner described above has the functionality of an electrode for forwarding electrical energy and, on account of its optically transparent or translucent matrix with embedded high refractive index particles (also referred to as high index particles), can simultaneously serve as a coupling-out layer for the light emitted by the optoelectronic component, at least in a wavelength range of visible light, for example at least in a partial range of the wavelength range of from approximately 380 nm to approximately 780 nm.

The refractive index relates in each case to at least one wavelength range in the visible wavelength spectrum of the electromagnetic radiation emitted by the optoelectronic component.

In one development, the optoelectronic component is formed as transparent or translucent. Furthermore, the optoelectronic component is formed as a component that emits light through the carrier (bottom emitter). Alternatively, the optoelectronic component is formed in such a way that the electromagnetic radiation is not emitted through the substrate, for example in the opposite direction from the substrate (top emitter). Furthermore, the optoelectronic component can be formed as an omnidirectionally emitting component, for example as a bidirectional component, for example as a bottom emitter and additionally as a top emitter.

In another development, the electrode includes at least one matrix material and particles embedded into the matrix, wherein the difference in refractive index between the at least one matrix material and the particles embedded into the matrix is at least 1. Using a matrix material and particles embedded into the matrix, wherein these two component parts have a difference in refractive index of at least 1 between the refractive indices of the matrix material and of the embedded particles, it is possible to significantly increase the scattering of the emitted light at least in a wavelength range of visible light, for example at least in a partial range of the wavelength range of from approximately 380 nm to approximately 780 nm.

In another development, the electrode includes at least one matrix material, wherein the at least one matrix material has a refractive index of less than or equal to 1.6. An electrode can be formed using a matrix material having a refractive index of less than or equal to 1.6, wherein such a refractive index serves to adapt the light transmissivity in such a way that the luminous intensity of an OLED is increased.

In another embodiment, the electrode includes particles embedded into the matrix, wherein the particles embedded into the matrix have a refractive index of greater than or equal to 1.7. One advantage of introducing particles having a refractive index of greater than or equal to 1.7 into a matrix material having a refractive index of less than or equal to 1.6 consists in the intensification of the scattering of the light in the layer for internally coupling out the emitted light at least in a wavelength range of visible light, for example at least in one partial range of the wavelength range of from approximately 380 nm to approximately 780 nm. Furthermore, by means of these two refractive indices for the matrix material and the embedded particles, the optical scattering behavior becomes definable in this way. The internal coupling-out layer formed therefrom has a desired optical effect at least in a wavelength range of visible light, for example at least in one partial range of the wavelength range of from approximately 380 nm to approximately 780 nm. For example more intense scattering of light of relatively short wavelength, for example blue light, and reduced scattering of light of relatively long wavelength, for example red light; or else vice versa. Furthermore, however, the scattering behavior of any other range of the visible electromagnetic spectrum can also be attenuated or intensified by means of the adaptation of matrix material and the high index particles embedded therein.

In another development, the electrode may include at least one matrix material and particles embedded into the matrix, wherein the at least one matrix material and/or the particles embedded into the matrix are/is electrically conductive. An electrode formed in this way is advantageous since the embedded, electrically conductive particles make it possible to adapt the electrical conductivity depending on the concentration of the embedded, electrically conductive particles within the matrix. This enables the electrode to be structured with regard to the electrical properties. As a result, the electrode can have regions having a higher conductivity and regions having a lower conductivity. This makes it possible that the conductivity within the electrode can be arranged spatially.

In another development, the electrode may include at least one matrix material, wherein the at least one material of the matrix includes one of the following materials: epoxy, epoxy adhesive, polymer fill, organic semiconductors that can be provided for example in the form of so-called small non-polymeric molecules (known as "small molecules organic semiconductors") (such as e.g. pentacene, tetracene) or semiconducting polymers, monomers or oligomers and a combination of these substances. The matrix material may include at least one organic semiconductor, wherein the at least one organic semiconductor includes at least one of the following materials: anthracene (paranaphthalene), acridone (9(10H)-acridone), aluminum tris(8-hydroxy-quinoline) (Alq3), benzenethiolate, Beq2, quinacridone (QAC), flavanthrone, indanthrone, indigo tin or 2,2'-bis(2,3-dihydro-3-oxoindolylidene), hexabenzocoronene, naphthalene derivatives, oligothiophenes, oligophenylene vinylenes, perinone, phthalocyanine, pentacene, perylene, polythiophenes, polyparaphenylene, polypyrrole, polyaniline, polyacetylene, polysulfur nitrides, polyvinylcarbazole, poly(3-hexylthiophene-2,5-diyl) (P3HT), tetracyanoquinodimethane TCNQ complexes, 3,4,9,10-perylenetetracarboxylic dianhydride (PTCDA) and derivatives thereof, 4,4',4"-tris(N,N-diphenylamino) triphenylamine (TDATA) and/or MePTCDI (Di-MePTCDI, known as N,N'-dimethyl-3,4,9,10-perylene-tetracarboxylic diimide, (PPI)). The matrix materials mentioned, owing to their properties with regard to price and conventional use as matrix material, can be provided cost-effectively and without great effort.

In another development, the electrode may include particles embedded into the matrix, wherein the particles embedded into the matrix include one of the following materials: aluminum-doped zinc oxide Al:ZnO, titanium dioxide (titanium(IV) oxide) $TiO_2$, aluminum oxide $Al_2O_3$, tantalum pentoxide $T_2O_5$, indium tin oxide ITO nanoparticles, carbon C nanotubes, graphene flakes and/or silver Ag nanowires.

In one development, the electrode can be formed as a layer, wherein the electrode has a layer thickness having a thickness of at least 20 nm, for example in a range of 20 nm to 5 µm, for example in a range of approximately 20 nm to approximately 300 nm, preferably in a range of approximately 100 nm to approximately 150 nm. A layer thickness of an electrode formed as a layer, which is in a range of approximately 20 nm to approximately 300 nm makes it possible that said electrode can be used in flexible and/or flat components, such as, for example, as a screen in mobile terminals or smart cards. The electrode has a layer thickness with regard to the particles such that the particles at the surface of the electrode are encapsulated with matrix material, with the result that the electrode has a smooth surface. Alternatively, at least some of the particles at the surface of the electrode are exposed.

In another development, the electrode can be formed as a layer, wherein the electrode has an electrical conductance in a range of approximately 2 ohms/square to approximately 50 ohms/square, preferably in a range of approximately 10 ohms/square to approximately 15 ohms/square. An electrode which is formed as a layer and whose electrical conductance is in a range of approximately 2 ohms/square to approximately 50 ohms/square can be reduced the concentration depending on the used material of the electrically conductive high index particles, such that the required conductivity of the electrode is formed with a minimal material outlay, as a result of which, for example, the production costs can be reduced.

In another development, the electrode may include particles embedded into the matrix, wherein the particles embedded into the matrix have a size in at least one dimension in a range of approximately 1 nm to approximately 3 µm, preferably in a range of approximately 1 nm to approximately 100 nm. Particles having a size in at least one dimension in a range of approximately 1 nm to approximately 3 µm can serve, depending on their size and the material used, as scattering centers in at least one wavelength range of visible light, for example at least in one partial range of the wavelength range of from approximately 380 nm to approximately 780 nm. Alternatively or additionally, the particles serve as electrically and/or thermally conductive particles. As a result, light can be scattered and/or the electrical energy can be forwarded by means of the electrically conductive particles. Furthermore, the conductivity and the scattering behavior can be adapted differently by a local variation of the concentration of the particles in the matrix.

In other words: in one development, the electrode includes in the matrix at least particles of a first size and particles of a second size, wherein the first size is different than the second size. By way of example, the first size is non-scattering for visible light and the second size is scattering for visible light. This makes it possible that the refractive index of the electrode and the light scattering effect of the electrode can be set independently of one another by means of the particles. Besides the refractive index setting, therefore, a scattering effect is additionally possible, and vice versa. The first size and the second size are in each case the average sizes of the particles, for example d50 of the distribution of the particle sizes of the particles of the first size and the distribution of the particle sizes of the particles of the second size. By means of introducing and mixing electrically conductive high index particles and small non-conductive high index particles, it is possible to set the conductivity of the layer and the refractive index of the layer separately from one another.

Additionally or alternatively, the electrode includes in the matrix at least particles having a first electrical conductivity and particles having a second electrical conductivity wherein the first conductivity is different than the second conductivity. This makes it possible that the electrode can be electrically structured, as described above. By way of example, the particles having the first conductivity are electrically insulating and the particles having the second conductivity are electrically conductive. By way of example, the particles of the first size have the first electrical conductivity and the particles of the second size have the second conductivity.

In various embodiments an optoelectronic component is provided, wherein the optoelectronic component includes an organic functional layer structure; and an electrode in accordance with the above-described electrode and the developments thereof, said electrode being electrically conductively coupled to the organic functional layer structure. The electrically conductively coupled electrode is the second electrode. Alternatively or additionally, the electrically conductively coupled electrode is the first electrode.

An optoelectronic component including an organic functional layer structure and an electrode electrically coupled to said organic functional layer structure, wherein said electrode can be formed as described above, can make it possible to combine two production steps to form one common production step. In other words, it is possible to dispense with the formation of a separate layer either for the internal coupling-out of the emitted light at least in a wavelength range of visible light (for example at least in one partial range of the wavelength range of from approximately 380 nm to approximately 780 nm) or for supplying with electrical energy, since these two functionalities can be combined with one another in one layer, as a result of which the production costs can be reduced.

In one development, the optoelectronic component may include an electrode, wherein the electrode is formed as an anode or as a cathode. Alternatively or additionally, the electrode is formed in such a way that it has a floating potential, for example is free of component-external connections. Since the electrode for the optoelectronic component can be formed both as an anode and as a cathode, both elements can be formed by one process step and, for example, an additional process step can thus be obviated.

In another development, the optoelectronic component can furthermore include an additional electrode electrically conductively coupled to the organic functional layer structure, wherein the organic functional layer structure is arranged between the electrode and the additional electrode. The additional electrode is the second electrode. Alternatively or additionally, the additional electrode is the first electrode. By means of the two electrodes, between which the organic functional layer structure is arranged and the latter is electrically conductively coupled to the two electrodes, an electrical circuit can be closed and, since the two electrodes can be formed by the same process step, no additional process step is necessary, as a result of which the process costs can be lowered.

In another development, the optoelectronic component may include an organic functional layer structure, wherein the organic functional layer structure includes a light emitting layer structure. An optoelectronic component including an organic functional layer structure which can be a light emitting layer structure can make it possible, for example, that such an optoelectronic component can be formed as an organic light emitting diode (OLED), during the production of which the electrode and the layer for internally coupling out the emitted light can be formed with one another in a common production process, at least with regard to a wavelength range of visible light, for example at least in one partial range of the wavelength range of from approximately 380 nm to approximately 780 nm.

In various embodiments, a method for producing an optoelectronic component is provided, wherein the method includes: forming an electrode by embedding particles into an optically transparent or translucent matrix including at least one matrix material, wherein the particles have a refractive index that is greater than the refractive index of the at least one matrix material, and wherein a difference in refractive index between the at least one matrix material and the particles embedded into the matrix is at least 0.05; and forming an organic functional layer structure electrically conductively coupled to the electrode.

A method for producing an optoelectronic component which includes forming an electrode as described above can be advantageous since, by means of the combination of an optically transparent and/or an optically translucent matrix into which particles having a different refractive index than the at least one matrix material can be embedded and an electrode during the production of an optoelectronic component, it is possible to dispense with a process step for producing one of the two layers used hitherto in conventionally formed optoelectronic components (one layer formed as electrode and one layer formed for internally coupling out the emitted light), as a result of which, for example, the production costs can be reduced.

The top electrode formed as a light emitting electrode is formed by means of at least one of the following methods: a wet-chemical method, for example spray coating or slot die coating, coevaporation of the materials of matrix and particles from the gas phase, for example chemical and/or physical vapor deposition.

In one development, the method may include forming an electrode by embedding particles into an optically transparent or translucent matrix including at least one matrix material, wherein the difference in refractive index between the at least one matrix material and the particles embedded into the matrix is at least 1.

Using a matrix material and the particles embedded into the matrix in the method for forming an electrode, wherein the difference in refractive index between the two materials is at least 1, it is possible to significantly increase the scattering of the emitted light at least in a wavelength range of visible light (for example at least in one partial range of the wavelength range of approximately 380 nm to approximately 780 nm), with the result that the properties of the emitted light from the optoelectronic component can advantageously be adapted, whereby for example softer light, i.e. emitted light from which harsh shadows have been eliminated and/or emitted light free of glare, can be formed.

In one development, the method may include forming an electrode by embedding particles into an optically transparent or translucent matrix including at least one matrix material, wherein the at least one matrix material has a refractive index of less than or equal to 1.6.

Forming an electrode can be carried out using a matrix material having a refractive index of less than or equal to 1.6, wherein such a refractive index can serve to adapt the light transmissivity in such a way that, for example, the luminous intensity of an OLED can be increased.

In one development, the method may include forming an electrode by embedding particles into an optically transparent or translucent matrix including at least one matrix material, wherein the particles embedded into the matrix have a refractive index of greater than or equal to 1.7.

Forming an electrode can be carried out using a matrix material in which particles having a refractive index of greater than or equal to 1.7 are embedded, wherein such a refractive index of the particles can be advantageous for adapting a desired scattering behavior of the electrode, such as, for example, for increasing the scattering of visible light from the higher-energy part of the visible electromagnetic spectrum, i.e. blue light, wherein the particles can also be chosen such that any other range from the visible electromagnetic spectrum can also be varied in its scattering behavior.

In another development, the method may include forming an electrode, wherein the electrode is applied on a substrate. The electrode is formed for example as a thin layer on or above the substrate, for example in or from a liquid or paste-like state of matter. Forming an electrode in these two states of matter can be advantageous if the electrode is intended to be applied in an areal fashion, such as, for example, in the case of large areas, since the methods used here for application to a large-area substrate require the use of liquid material.

In one development, the method may include forming an electrode, wherein the electrode is applied on a substrate by means of one of the following methods: a screen printing method, a slot die method, a stencil printing method, blade coating and/or a roll-to-roll method.

The last-mentioned methods for applying a material which serves for forming an electrode on a substrate can be provided simply and cost-effectively on account of their conventional use and dissemination, as a result of which applying such an electrode, as described above, can result in lower costs and effort during production.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a schematic cross-sectional view of the optoelectronic component in accordance with various embodiments;

FIG. 2 shows a schematic cross-sectional view of an optically functional layer structure of an organic light emitting diode in accordance with various embodiments.

DETAILED DESCRIPTION

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various exemplary embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

FIG. 1 shows a schematic cross-sectional view of an optoelectronic component 100, in accordance with various embodiments.

An optoelectronic component 100 can be understood to mean an embodiment of an electronic component, wherein the optoelectronic component 100 includes an optically active region. The optically active region is formed such that electromagnetic radiation can be absorbed in the optically active region and a photocurrent or an electrical voltage can be formed therefrom, or electromagnetic radiation can be emitted by means of a voltage applied to the optically active region. An optoelectronic component 100 including two planar, optically active sides can be formed for example as transparent, for example as a transparent organic light emitting diode. The optically active region can have a planar, optically active side and a planar, optically inactive side, for example an organic light emitting diode designed as a top emitter or bottom emitter.

An organic (opto)electronic component 100 can be formed as an organic light emitting diode (OLED), an organic photovoltaic installation, for example an organic solar cell, an organic photometer, an organic field effect transistor (OFET) and/or an organic electronic system.

The organic field effect transistor can be an all-OFET, in which all the layers are organic. An organic, electronic component 100 may include an organic functional layer structure 112, which is synonymously also designated as organic functional layer structure. The organic functional layer structure 112 may include or be formed from an organic substance or an organic substance mixture which is designed for example for providing electromagnetic radiation from an electric current provided and/or for providing an electric current from electromagnetic radiation provided.

Even though the various embodiments are described on the basis of an OLED below, these embodiments can, however, readily also be applied to the other electronic and optoelectronic components 100 mentioned above.

An organic substance can be understood to mean a carbon compound which, regardless of the respective state of matter, is present in chemically uniform form and is characterized by characteristic physical and chemical properties.

An inorganic substance can be understood to mean a compound which, regardless of the respective state of matter, is present in chemically uniform form and is characterized by characteristic physical and chemical properties, without carbon or a simple carbon compound.

An organic-inorganic substance (hybrid substance) can be understood to mean a compound which, regardless of the respective state of matter, is present in chemically uniform form and is characterized by characteristic physical and chemical properties, including compound portions which contain carbon and/or are free of carbon.

The optoelectronic component 100, for example an electromagnetic radiation providing electronic component 100, for example a light emitting component 100, for example in the form of an organic light emitting diode 100, may include a hermetically impermeable (i.e. absolute impermeability, for example a seal preventing exchange of air or water) substrate 102. The hermetic impermeability of the substrate 102 can either be provided on account of an intrinsic substrate material property, as in the case of a glass substrate, for example, or it can be achieved by means of a suitable optional barrier layer (not illustrated) being applied on or above the substrate 102. The hermetically impermeable substrate 102 can serve for example as a carrier element for electronic elements or layers, for example light emitting elements. By way of example, the substrate 102 may include or be formed from glass, quartz and/or a semiconductor material or any other suitable substance. Furthermore, the hermetically impermeable substrate 102 may include or be formed from a plastics film or a laminate including one or including a plurality of plastics films. The plastic may include or be formed from one or a plurality of polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyethersulfone (PES) and/or polyethylene naphthalate (PEN). The substrate 102 may include one or a plurality of the substances mentioned above.

The hermetically impermeable substrate 102 may include or be formed from a metal or a metal compound, for example copper, silver, gold, platinum, iron, for example a metal compound, for example steel or the like. A hermetically impermeable substrate 102 including a metal or a metal compound can also be formed as a metal film or a metal-coated film.

The hermetically impermeable substrate 102 can be embodied as translucent or even transparent. In the case of a hermetically impermeable substrate 102 including a metal, the metal can be formed for example as a thin layer, transparent or translucent layer, and/or the metal can be part of a mirror structure.

In various embodiments, a matrix 104 can be understood to mean the material in composite materials in which other constituents are embedded.

In various embodiments, the term "translucent" or "translucent layer" can be understood to mean that a layer is transmissive to light, for example to the light generated by the light emitting component, for example in one or more wavelength ranges, for example to light in a wavelength range of visible light (for example at least in one partial range of the wavelength range of from approximately 380 nm to approximately 780 nm). By way of example, in various embodiments, the term "translucent layer" should be understood to mean that substantially the entire quantity of light coupled into a structure (for example a layer) is also coupled out from the structure (for example layer), wherein part of the light can be scattered in this case.

In various embodiments, the term "transparent" or "transparent layer" can be understood to mean that a layer is transmissive to light (for example at least in one partial range of the wavelength range of from approximately 380 nm to approximately 780 nm), wherein light coupled into a structure (for example a layer) is also coupled out from the structure (for example layer) substantially without scattering or light conversion. Consequently, in various embodiments, "transparent" should be regarded as a special case of "translucent".

For the case where, for example, a light emitting monochromatic or emission spectrum-limited electronic component is intended to be provided, it suffices for the optically translucent layer structure to be translucent at least in a partial range of the wavelength range of the desired monochromatic light or for the limited emission spectrum.

The hermetically impermeable substrate 102 may include a mechanically rigid region and/or a mechanically flexible region or be formed in this way. A substrate 102 including a mechanically rigid region and a mechanically flexible region can be structured, for example, by virtue for example of the rigid region and the flexible region having a different thickness.

A mechanically flexible, hermetically impermeable substrate 102 or the mechanically flexible region can be formed for example as a film, for example a plastics film, a metal film or a thin glass.

In various embodiments, the organic light emitting diode 100 (or else the light emitting component 100 in accordance with the embodiments described above or embodiments also described below) can be designed as a so-called top and/or bottom emitter. A top and/or bottom emitter can also be referred to as an optically transparent component, for example a transparent organic light emitting diode.

Although FIG. 1 illustrates that the optically functional layer structure 112 is formed only on one side of the hermetically impermeable substrate 102, an optically functional layer structure 112 can, however, also be arranged on or above both sides of the hermetically impermeable substrate 102, i.e. above and below the hermetically impermeable substrate 102.

An electrically active region 126 of the light emitting component 100 can be arranged on or above the hermetically impermeable substrate 102. The electrically active region 126 can be understood as that region of the light emitting component 100 in which an electric current for the operation of the light emitting component 100 flows. In various embodiments, the electrically active region 126 may include a first electrode 110, a second electrode 114 and an organic functional layer structure 112, as will be explained in even greater detail below.

In this regard, in various embodiments, the first electrode 110 (for example in the form of a first electrode layer 110) can be applied on or above the hermetically impermeable substrate 102. The first electrode 110 (also referred to hereinafter as bottom electrode 110) can be formed from an electrically conductive substance, such as from a wet-chemically formed matrix 104, for example.

In one embodiment, the electrode layer 110 can be formed from more than one layer. Although the layer 102 is illustrated only as one layer in FIG. 1, the layer 102 may include a plurality of layers, i.e. more than two layers, i.e. 2, 3, 4, . . . , N layers, wherein N is a natural number. A plurality of electrode layers 110 can be used to form a gradient in the internal stepwise coupling-out and/or coupling-in of light via the plurality of layers 102.

In various embodiments, furthermore, the first electrode 110 can be formed from a transparent or even translucent substance, such as from a wet-chemically formed matrix 104, for example. An electrode layer 110 formed from a transparent or even translucent substance can be used as an electrode and as an internal coupling-out layer.

The matrix 104 formed in a wet-chemical method can be formed for example from one or a plurality of organic and/or inorganic, optically low refractive index material(s), such as, for example, an epoxy, an epoxy adhesive, a polymer fill, and/or at least one organic semiconductor that can be provided for example in the form of so-called small non-polymeric molecules (known as "small molecules organic semiconductors") (such as e.g. pentacene, tetracene) or semiconducting polymers, monomers or oligomers and a combination of these substances. The matrix material may include organic semiconductor, wherein the at least one organic semiconductor includes at least one of the following materials: anthracene (paranaphthalene), acridone (9(10H)-acridone), aluminum tris(8-hydroxyquinoline) (Alq3), benzenethiolate, Beq2, quinacridone (QAC), flavanthrone, indanthrone, indigo tin or 2,2'-bis(2,3-dihydro-3-oxoindolylidene), hexabenzocoronene, naphthalene derivatives, oligothiophenes, oligophenylene vinylenes, perinone, phthalocyanine, pentacene, perylene, polythiophenes, polyparaphenylene, polypyrrole, polyaniline, polyacetylene, polysulfur nitrides, polyvinylcarbazole, poly(3-hexylthiophene-2,5-diyl) (P3HT), tetracyanoquinodimethane TCNQ complexes, 3,4,9,10-perylenetetracarboxylic dianhydride (PTCDA) and derivatives thereof, 4,4',4"-tris(N,N-diphenylamino) triphenylamine (TDATA) and/or MePTCDI (Di-MePTCDI, known as N,N'-dimethyl-2,3,4,9,10-perylene-tetracarboxylic diimide, (PPI)).

In various embodiments, the term "low refractive index", "optically low refractive index" or "an optically high refractive index material" can be understood to mean that a material has a refractive index in the visible electromagnetic spectrum (i.e. at least in a wavelength range of from approximately 380 nm to 780 nm) of less than or equal to 1.6. Furthermore, particles 106 and/or nanoparticles can be introduced into the matrix 104. Said particles 106 and/or nanoparticles 106 embedded into the matrix can be electrically conductive and/or be optically high refractive index particles and/or nanoparticles. By introducing the high refractive index particles 106 (also referred to as high index particles) and/or nanoparticles 106, it is possible to modify the average refractive index of the electrode 110, such as, for example, in that the average refractive index of the transparent or even translucent electrode 110 is increased by means of high refractive index particles 106 being introduced into the low refractive index matrix.

For the case of an electrically conductive optically active electrode layer 110, by means of introducing electrically conductive and optically high refractive index particles 106 and/or nanoparticles 106 into the matrix 104 from which the optically active electrode layer 110 is formed, In various embodiments, the term "high refractive index", "optically high refractive index" or "an optically high refractive index material" can be understood to mean that a material has a refractive index in the visible electromagnetic spectrum (i.e. at least in a wavelength range of from approximately 380 nm to approximately 780 nm) of greater than or equal to 1.7.

In various embodiments, the particles 106 and/or nanoparticles 106 embedded into the matrix 104 preferably have a refractive index in the visible electromagnetic spectrum (i.e. at least in a wavelength range of from approximately 380 nm to approximately 780 nm), which is in a range of from approximately 1.7 to approximately 3.1, wherein preferably the average refractive indices differ between the low refractive index matrix 104 and the high refractive index particles 106 and/or nanoparticles 106 by at least 0.05.

In various embodiments, the particles 106 and/or nanoparticles 106 can be formed for example from transparent conductive oxides. Transparent conductive oxides (TCOs) are transparent conductive substances, for example metal oxides, such as, for example, zinc oxide, tin oxide, cadmium oxide, titanium dioxide ($TiO_2$), indium oxide, tantalum(V) oxide or indium tin oxide (ITO). Alongside binary metal-oxygen compounds such as, for example, ZnO, $SnO_2$ or $In_2O_3$, ternary metal-oxygen compounds such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs and can be used in various embodiments. Furthermore, the TCOs do not necessarily correspond to a stoichiometric composition and can furthermore be p-doped or n-doped.

In various embodiments, the particles 106 and/or nanoparticles 106 may include one or a plurality of the following materials: aluminum-doped zinc oxide (Al:ZnO), titanium dioxide ($TiO_2$), tantalum pentoxide ($Ta_2O_5$), indium tin oxide (ITO) and/or a mixture thereof.

In various embodiments, the particles 106 and/or nanoparticles 106 include one or a plurality of the non-conductive high refractive index materials: titanium dioxide ($TiO_2$), aluminum oxide ($Al_2O_3$) or a mixture thereof.

In various embodiments, the particles 106 and/or nanoparticles 106 embedded into the matrix 104 from which the electrode 110 is formed have a size which in at least one dimension is in a range of approximately 1 nm to approximately 3 μm, preferably in a range of approximately 1 nm to approximately 100 nm.

Furthermore, in various embodiments, the particles 106 and/or nanoparticles 106 embedded into the matrix 104 can have the following geometrical shapes: spherical, aspherical, for example prismatic, ellipsoidal, hollow, compact, laminar or rod-shaped.

In various embodiments, the optically active, electrically conductive electrode layer 110 can have a layer thickness that is in a range of approximately 20 nm to approximately 300 nm, preferably in a range of approximately 100 nm to approximately 150 nm.

In various embodiments, the electrode 110 can have an electrical conductance (also referred to as sheet resistance) which is in a range of approximately 2 ohms/square to approximately 50 ohms/square, preferably in a range of approximately 5 ohms/square to approximately 20 ohms/square or preferably in a range of approximately 10 ohms/square to approximately 15 ohms/square.

In various embodiments, the conductivity and the refractive index in the visible electromagnetic spectrum (i.e. at least in a wavelength range of from approximately 380 nm to approximately 780 nm) can be designed separately from one another if a mixture of electrically conductive and optically high refractive index particles 106 and/or nanoparticles 106 and non-electrically conductive particles 106 and/or nanoparticles 106 is formed, the size of which in at least one dimension is less than approximately 100 nm, and is inserted into the matrix 104.

In various embodiments, the scattering in the visible electromagnetic spectrum (i.e. at least in a wavelength range of from approximately 380 nm to approximately 780 nm) can be achieved in a targeted manner at additional particles 106 and/or nanoparticles 106 if a mixture of electrically conductive, optically high refractive index particles 106 and/or nanoparticles 106 and optically high refractive index particles 106 and/or nanoparticles 106 is formed, the size of which in at least one dimension is greater than approximately 100 nm, and is inserted into the matrix 104.

The first electrode 110 may include one or more of the following substances as an alternative or in addition to the substances mentioned above: networks composed of metallic nanowires and nanoparticles, for example composed of Ag; networks composed of carbon nanotutbes; graphene particles (e.g. so-called graphene flakes) and graphene layers; networks composed of semiconducting nanowires.

Furthermore, the conductivity and the refractive index in the visible electromagnetic spectrum (i.e. at least in a wavelength range of from approximately 380 nm to approximately 780 nm) can be designed separately from one another if a mixture of electrically conductive and optically high refractive index particles 106 and/or nanoparticles 106 and the abovementioned alternative or additional substances, such as, for example, Ag nanowires and nanoparticles and/or carbon nanotubes and/or graphene particles (e.g. so-called graphene flakes) and graphene layers and/or networks composed of semiconducting nanowires, is formed, the size of which in at least one dimension is less than approximately 100 nm, and is inserted into the matrix 104.

Furthermore, the first electrode 110 may include electrically conductive polymers or transition metal oxides or electrically conductive transparent oxides.

Furthermore, in various embodiments, the particles 106 and/or nanoparticles 106 embedded into the matrix 104 can be formed from a material that absorbs ultraviolet electromagnetic radiation (UV radiation, in a wavelength range of from approximately 10 nm to approximately 380 nm), as a result of which the optically functional layer structure 112 is protected against damage owing to external irradiation by UV radiation.

All the above-mentioned embodiments of mixtures of the various abovementioned particles 106 and/or nanoparticles 106, and all the above-mentioned materials and forms can be formed in any combination with one another.

The first electrode 110 can be formed as an anode, that is to say as a hole-injecting electrode 110, or as a cathode, that is to say as an electron-injecting electrode 110. Furthermore, the electrode 110 can be formed as an intermediate layer for a CGL (charge generating layer) OLED.

An optoelectronic component 100 (e.g. an organic light emitting diode (OLED), for example a white organic light emitting diode (WOLED), a solar cell, etc.) on an organic basis is usually distinguished by its mechanical flexibility and moderate production conditions. Compared with a component composed of inorganic materials, an optoelectronic component 100 on an organic basis can be produced potentially cost-effectively owing to the possibility of large-area production methods (e.g. roll-to-roll production methods).

A WOLED consists e.g. of an anode and a cathode with a functional layer structure therebetween. The organic functional layer structure consists of one or a plurality of emitter layer(s) in which the light is generated, one or a plurality of charge generating layer structure(s) including in each case two or more charge generating layers (CGLs) for charge generation, and one or a plurality of electron blocking layer(s) also designated as hole transport layer(s) (HTL), and one or a plurality of hole blocking layer(s), also designated as electron transport layer(s) (ETL), in order to direct the current flow.

The luminance of an OLED is limited, inter alia, by the maximum current density that can flow through the diode. In order to increase the luminance of an OLED, it is known to combine one or a plurality thereof one on top of another in a series (so-called stacked or tandem OLED). By means of stacking one above another, significantly longer lifetimes can be obtained in the OLED with practically the same efficiency and identical luminance. With the same current density, double to treble the luminance can thus be realized. In this case, the layers at which the diodes contact one another are accorded particular importance. An electron-conducting region of one diode and a hole-conducting region of the other diode meet at said layers. The layers between these regions, the so-called charge generating layer (CGL) structure should be able to generate electron-hole pairs, separate them from one another and inject electrons and holes in opposite directions into the diodes. Continuous charge transport through the OLED series circuit becomes possible as a result.

Stacking one above another therefore requires charge generating layers consisting of a highly doped p-n junction. The charge generating layer structure conventionally includes a p-doped and an n-doped charge generating layer, which are directly physically connected to one another, such that clearly a p-n junction is formed. In the p-n junction, a space charge zone is formed, in which electrons of the n-doped charge generating layer migrate into the p-doped charge generating layer. This generates a potential jump in the p-n junction or a built-in voltage. When a voltage is applied to the p-n junction in the reverse direction, Wannier-Mott excitons are generated in the space charge zone and can generate electromagnetic radiation (e.g. visible light) in the emitter layers by means of recombination. The potential jump or the built-in voltage can be influenced by means of the work function, the doping of the layers, and the formation of interface dipoles at the p-n junction by means of the substances used.

The p-doped and n-doped charge generating layers can consist in each case of one or a plurality of organic and/or inorganic, optically low refractive index substance(s) (matrix). The respective matrix is usually admixed with one or a plurality of organic or inorganic substances (dopants) during the production of the charge generating layer, in order to increase the conductivity of the matrix. This doping can generate electrons (n-doped; dopants e.g. metals having a low work function, e.g. Na, Ca, Cs, Li, Mg, or compounds thereof, e.g. $Cs_2CO_3$, $Cs_3PO_4$, or organic dopants from NOVALED, e.g. NDN-1, NDN-26) or holes (p-doped; dopant e.g. transition metal oxides, e.g. $MoO_x$, $WO_x$, $VO_x$, organic compounds, e.g. Cu(I)pFBz, F4-TCNQ, or organic dopants from NOVALED, e.g. NDP-2, NDP-9) as charge carriers in the matrix. An organic substance, e.g. αNPD, is usually used as the substance of the hole transport layer above or on the hole-conducting charge generating layer.

The first electrode 110 can have a first electrical contact pad, to which a first electrical potential (provided by an energy source (not illustrated), for example a current source or a voltage source) can be applied. Alternatively, the first electrical potential can be applied to the substrate 102 and via the latter then indirectly to the first electrode 110. The first electrical potential can be for example the ground potential or some other predefined reference potential.

The electrode 110 can be applied on the substrate 102 by means of one of the following methods: screen printing method, slot die method, stencil printing method, blade coating and roll-to-roll method.

Furthermore, the electrically active region 126 of the light emitting component 100 may include an organic functional layer structure 112, which is applied or formed on or above the first electrode 110.

The organic functional layer structure 112 may include one or a plurality of emitter layer(s) 118, for example including fluorescent and/or phosphorescent emitters, and one or a plurality of hole conduction layer(s) 116 (also referred to as hole transport layer(s) 120). In various embodiments, alternatively or additionally, one or a plurality of electron conduction layer(s) 116 (also referred to as electron transport layer(s) 116) can be provided.

Examples of emitter materials which can be used for the emitter layer(s) 118 in the light emitting component 100 in accordance with various embodiments include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl)iridium III), green phosphorescent Ir(ppy)$_3$ (tris(2-phenylpyridine)iridium III), red phosphorescent Ru (dtb-bpy)$_3$*2(PF$_6$) (tris[4,4'-di-tert-butyl-(2,2')-bipyridine]-ruthenium(III) complex) and blue fluorescent DPAVBi (4,4-bis[4-(di-p-tolylamino)styryl]biphenyl), green fluorescent TTPA (9,10-bis[N,N-di(p-tolyl)amino]-anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited in particular by means of a wet-chemical method, such as, for example, a spin coating method.

The emitter materials can be embedded in a suitable manner in a matrix material.

It should be pointed out that other suitable emitter materials are likewise provided in other embodiments.

The emitter materials of the emitter layer(s) 118 of the light emitting component 100 can be selected for example such that the light emitting component 100 emits white light. The emitter layer(s) 118 may include a plurality of emitter materials that emit in different colors (for example blue and yellow or blue, green and red); alternatively, the emitter layer(s) 118 can also be constructed from a plurality of partial layers, such as a blue fluorescent emitter layer 118 or blue phosphorescent emitter layer 118, a green phosphorescent emitter layer 118 and a red phosphorescent emitter layer 118. By means of mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The organic functional layer structure 112 can generally include one or a plurality of electroluminescent layer(s). The one or the plurality of electroluminescent layer(s) may include organic polymers, organic oligomers, organic monomers, organic small, non-polymeric molecules ("small molecules") or a combination of these substances. By way of example, the organic functional layer structure 112 may include one or a plurality of electroluminescent layer(s) embodied as hole transport layer 120, thereby enabling for example in the case of an OLED an effective hole injection into an electroluminescent layer or an electroluminescent region. Alternatively, in various embodiments, the organic functional layer structure 112 may include one or a plurality of functional layer(s) embodied as electron transport layers 116, thereby enabling for example in an OLED an effective electron injection into an electroluminescent layer or an electroluminescent region. By way of example, tertiary amines, carbazo derivatives, conductive polyaniline or polyethylene dioxythiophene can be used as substance for the hole transport layer 120. In various embodiments, the one or the plurality of electroluminescent layers can be embodied as electroluminescent layer.

In various embodiments, the hole transport layer 120 can be applied, for example deposited, on or above the first electrode 110, and the emitter layer 118 can be applied, for example deposited, on or above the hole transport layer 120. In various embodiments, the electron transport layer 116 can be applied, for example deposited, on or above the emitter layer 118.

In various embodiments, the organic functional layer structure 112 (that is to say for example the sum of the thicknesses of hole transport layer(s) 120 and emitter layer(s) 118 and electron transport layer(s) 116) can have a layer thickness of a maximum of approximately 1.5 µm, for example a layer thickness of a maximum of approximately 1.2 µm, for example a layer thickness of a maximum of approximately 1.0 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm.

In various embodiments, the organic functional layer structure 112 may include for example a stack of a plurality of organic light emitting diode units (OLED units) arranged directly one above another, wherein each OLED unit can have for example a layer thickness of a maximum of approximately 1.5 µm, for example a layer thickness of a maximum of approximately 1.2 µm, for example a layer thickness of a maximum of approximately 1.0 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm.

In various embodiments, the organic functional layer structure 112 may include for example a stack of two, three or four OLED units arranged directly one above another, in which case for example the organic functional layer structure 112 can have a layer thickness of a maximum of approximately 3 µm.

The light emitting component 100 can optionally generally include further organic functional layers, for example arranged on or above the one or the plurality of emitter layers 118 or on or above the electron transport layer(s) 116, which serve to further improve the functionality and thus the efficiency of the light emitting component 100.

The second electrode 114 (for example in the form of a second electrode layer 114) can be applied on or above the organic functional layer structure 112 or, if appropriate, on or above the one or the plurality of further organic functional layer structures.

In various embodiments, the second electrode 114 may include or be formed from the same substances as the first electrode 110, wherein metals are particularly suitable in various embodiments.

In various embodiments, the second electrode 114 (for example for the case of a metallic second electrode 114) can have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 114 can generally be formed in a manner similar to the first electrode 110, or differently than the latter. In various embodiments, the second electrode 114 can be formed from one or a plurality of the substances and with the respective layer thickness as described above in association with the first electrode 110. In various embodiments, the first electrode 110 and the second electrode 114 are both formed as translucent or transparent. Consequently, the light emitting component 100 illustrated in FIG. 1 can be formed as a top and bottom emitter (to put it another way, as a transparent light emitting component 100).

The second electrode 114 can be formed as an anode, that is to say as a hole-injecting electrode, or as a cathode, that is to say as an electron-injecting electrode.

The second electrode 114 can have a second electrical terminal, to which a second electrical potential (which is different than the first electrical potential), provided by the energy source, can be applied. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

An encapsulation 108, for example in the form of a barrier thin-film layer/thin-film encapsulation 108, can optionally also be formed on or above the second electrode 114 and thus on or above the electrically active region 126.

In the context of this application, a "barrier thin-film layer" 108 or a "barrier thin film" 108 can be understood to mean for example a layer or a layer structure which is suitable for forming a barrier against chemical impurities or atmospheric substances, in particular against water (moisture) and oxygen. In other words, the barrier thin-film layer 108 is formed in such a way that OLED-damaging substances such as water, oxygen or solvent cannot penetrate through it or at most very small proportions of said substances can penetrate through it.

In accordance with one configuration, the barrier thin-film layer 108 can be formed as an individual layer (to put it another way, as a single layer). In accordance with an alternative comparison, the barrier thin-film layer 108 may include a plurality of partial layers formed one on top of another. In other words, in accordance with one configuration, the barrier thin-film layer 108 can be formed as a layer stack. The barrier thin-film layer 108 or one or a plurality of partial layers of the barrier thin-film layer 108 can be formed for example by means of a suitable deposition method, e.g. by means of an atomic layer deposition (ALD) method in accordance with one configuration, e.g. a plasma enhanced atomic layer deposition (PEALD) method or a plasmaless atomic layer deposition (PLALD) method, or by means of a chemical vapor deposition (CVD) method in accordance with another configuration, e.g. a plasma enhanced chemical vapor deposition (PECVD) method or a plasmaless chemical vapor deposition (PLCVD) method, or alternatively by means of other suitable deposition methods.

By using an atomic layer deposition (ALD) method, it is possible for very thin layers to be deposited. In particular, layers having layer thicknesses in the atomic layer range can be deposited.

In accordance with one configuration, in the case of a barrier thin-film layer 108 including a plurality of partial layers, all the partial layers can be formed by means of an atomic layer deposition method. A layer sequence including only ALD layers can also be designated as "nanolaminate".

In accordance with an alternative configuration, in the case of a barrier thin-film layer 108 including a plurality of partial layers, one or a plurality of partial layers of the barrier thin-film layer 108 can be deposited by means of a different deposition method than an atomic layer deposition method, for example by means of a vapor deposition method.

In accordance with one configuration, the barrier thin-film layer 108 can have a layer thickness of approximately 0.1 nm (one atomic layer) to approximately 1000 nm, for example a layer thickness of approximately 10 nm to approximately 100 nm in accordance with one configuration, for example approximately 40 nm in accordance with one configuration.

In accordance with one configuration in which the barrier thin-film layer 108 includes a plurality of partial layers, all the partial layers can have the same layer thickness. In accordance with another configuration, the individual partial layers of the barrier thin-film layer 108 can have different layer thicknesses. In other words, at least one of the partial layers can have a different layer thickness than one or more other partial layers.

In accordance with one configuration, the barrier thin-film layer 108 or the individual partial layers of the barrier thin-film layer 108 can be formed as translucent or transparent layer. In other words, the barrier thin-film layer 108 (or the individual partial layers of the barrier thin-film layer 108) can consist of a translucent or transparent substance (or a substance mixture that is translucent or transparent).

In accordance with one configuration, the barrier thin-film layer 108 or (in the case of a layer stack including a plurality of partial layers) one or a plurality of the partial layers of the barrier thin-film layer 108 may include or be formed from one of the following substances: aluminum oxide, zinc oxide, zirconium oxide, titanium dioxide, hafnium oxide, tantalum oxide, lanthanum oxide, silicon oxide, silicon nitride, silicon oxynitride, indium tin oxide, indium zinc oxide, aluminum-doped zinc oxide, and mixtures and alloys thereof. In various embodiments, the barrier thin-film layer 108 or (in the case of a layer stack including a plurality of partial layers) one or a plurality of the partial layers of the barrier thin-film layer 108 may include one or a plurality of high refractive index substances, to put it another way one or a plurality of substances having a high refractive index, for example having a refractive index of at least 2.

In one configuration, the cover 124, for example composed of glass, can be applied for example by means of frit bonding (glass frit bonding/glass soldering/seal glass bonding) by means of a conventional glass solder in the geometrical edge regions of the organic optoelectronic component 100 with the barrier thin-film layer 108.

In various embodiments, an adhesive and/or a protective lacquer 122 can be provided on or above the barrier thin-film layer 108 and can be used to fix, for example adhesively bond, for example a cover 124 (for example a glass cover 126, a metal film cover 124, a sealed plastics film cover 124) on the barrier thin-film layer 108. In various embodiments, the optically translucent layer composed of adhesive and/or protective lacquer 122 can have a layer thickness of greater than 1 µm, for example a layer thickness of a plurality of µm.

In various embodiments, the adhesive may include or be a lamination adhesive.

In various embodiments, light scattering particles can also be embedded into the layer of the adhesive (also referred to as adhesive layer) and can lead to a further improvement in the color angle distortion and the coupling-out efficiency. In various embodiments, the light-scattering particles provided can be, for example, dielectric scattering particles, such as, for example, metal oxides, such as, for example, silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium dioxide. Other particles may also be suitable provided that they have a refractive index that is different than the effective refractive index of the matrix of the translucent layer structure, for example air bubbles, acrylate, or hollow glass beads. Furthermore, by way of example, metallic nanoparticles, metals such as gold, silver, iron nanoparticles, or the like can be provided as light-scattering particles.

In various embodiments, between the second electrode 114 and the layer composed of adhesive and/or protective lacquer 122, an electrically insulating layer (not illustrated) can also be applied, for example SiN, for example having a layer thickness in a range of approximately 300 nm to approximately 1.5 μm, for example having a layer thickness in a range of approximately 500 nm to approximately 1 μm, in order to protect electrically unstable materials, during a wet-chemical process for example.

In various embodiments, the adhesive can be designed in such a way that it itself has a refractive index that is less than the refractive index of the cover 124. Such an adhesive can be for example a low refractive index adhesive such as, for example, an acrylate having a refractive index of approximately 1.3. In one configuration, an adhesive can be for example a high refractive index adhesive which for example includes high refractive index, non-scattering particles and has an average refractive index that approximately corresponds to the average refractive index of the organic functional layer structure, for example in a range of approximately 1.7 to approximately 2.0. Furthermore, a plurality of different adhesives can be provided which form an adhesive layer sequence.

Furthermore, it should be pointed out that, in various embodiments, an adhesive 122 can also be completely dispensed with, for example in configurations in which the cover 124, for example composed of glass, is applied to the barrier thin-film layer 108 by means of plasma spraying, for example.

In various embodiments, the cover 124 and/or the adhesive 122 can have a refractive index (for example at a wavelength of 633 nm) of 1.55.

Furthermore, in various embodiments, one or a plurality of antireflection layers (for example combined with the encapsulation 108, for example the barrier thin-film layer 108) can additionally be provided in the light emitting component 100.

FIG. 2 shows a schematic block diagram of a method for producing an optoelectronic component 200, in accordance with various embodiments, wherein the method for producing an optoelectronic component 200 includes: forming an electrode by embedding particles and/or nanoparticles having a refractive index of greater than or equal to 1.7 into an optically transparent or translucent matrix including a material having a refractive index of less than or equal to 1.6 in step 201; and forming a light emitting layer structure electrically conductively coupled to the electrode in step 202.

In accordance with various embodiments, the electrode 110 used in the method is applied on or above a substrate 102. Applying the electrode on a hermetically impermeable substrate 102 can be carried out using the following methods: screen printing method, slot die method, stencil printing method, blade coating and roll-to-roll method.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
   an organic functional layer structure; and
   an electrode on or above the organic functional layer structure, said electrode being electrically conductively coupled to the organic functional layer structure;
   wherein the electrode comprises:
   an optically transparent or translucent matrix comprising at least one matrix material,
   wherein the matrix material is electrically non-conducting; and
   particles embedded into the matrix, said particles having a refractive index that is greater than the refractive index of the at least one matrix material;
   wherein a difference in refractive index between the at least one matrix material and the particles embedded into the matrix is at least 0.05.

2. The optoelectronic component as claimed in claim 1, wherein the difference in refractive index between the at least one matrix material and the particles embedded into the matrix is at least 1.

3. The optoelectronic component as claimed in claim 1, wherein the at least one matrix material has a refractive index of less than or equal to 1.6.

4. The optoelectronic component as claimed in claim 1, wherein the particles embedded into the matrix have a refractive index of greater than or equal to 1.7.

5. The optoelectronic component as claimed in claim 1, wherein the particles embedded into the matrix are electrically conductive.

6. The optoelectronic component as claimed in-claim 1, wherein the material of the matrix comprises one of the following materials:
   epoxy;
   epoxy adhesive; and
   polymer fill.

7. The optoelectronic component as claimed in claim 1, wherein the particles embedded into the matrix comprise one of the following materials:
   aluminum-doped zinc oxide Al:ZnO;
   aluminum oxide Al2O3;
   tantalum pentoxide T2O5;
   titanium dioxide TiO2;
   indium tin oxide ITO nanoparticles;
   carbon C nanotubes;
   graphene flakes; and
   silver Ag nanowires.

8. The optoelectronic component as claimed in claim 1, wherein the electrode has a layer thickness in a range of approximately 20 nm to approximately 300 nm.

9. The optoelectronic component as claimed in claim 1, wherein the electrode has an electrical conductance in a range of approximately 2 ohms/square to approximately 50 ohms/square.

10. The optoelectronic component as claimed in claim 1, wherein the particles embedded into the matrix have a size in at least one dimension in a range of approximately 1 nm to approximately 3 µm.

11. The optoelectronic component as claimed in claim 1, further comprising:
an additional electrode electrically conductively coupled to the organic functional layer structure;
wherein the organic functional layer structure is arranged between the electrode and the additional electrode.

12. The optoelectronic component as claimed in-claim 1, wherein the organic functional layer structure comprises a light emitting layer structure,
wherein the optoelectronic component is formed as a transparent organic light emitting diode or an organic light emitting diode designed as a top emitter.

13. An optoelectronic component, comprising:
an organic functional layer structure; and
an electrode electrically conductively coupled to the organic functional layer structure;
wherein the electrode comprises:
an optically transparent or translucent matrix comprising at least one matrix material,
wherein the matrix material is electrically non-conducting; and
particles embedded into the matrix, said particles having a refractive index that is greater than the refractive index of the at least one matrix material;
wherein a difference in refractive index between the at least one matrix material and the particles embedded into the matrix is at least 0.05, and
wherein the particles comprise at least particles of a first size and particles of a second size, wherein the first size is different than the second size.

14. A method for producing an optoelectronic component, the method comprising:
forming an organic functional layer structure; and
forming an electrode on or above the organic functional layer structure by embedding particles into an optically transparent or translucent matrix comprising at least one matrix material, wherein the matrix material is electrically non-conducting, wherein the particles have a refractive index that is greater than the refractive index of the at least one matrix material, and wherein a difference in refractive index between the at least one matrix material and the particles embedded into the matrix is at least 0.05; and wherein the electrode is electrically conductively coupled to the organic functional layer structure.

15. The method as claimed in claim 14, wherein the electrode is applied on the organic functional layer structure by means of one of the following methods:
screen printing method;
slot die method;
stencil printing method;
blade coating; and
roll-to-roll method.

* * * * *